(12) United States Patent
Busch et al.

(10) Patent No.: US 8,089,767 B2
(45) Date of Patent: Jan. 3, 2012

(54) COOLING SYSTEM, COLD PLATE AND ASSEMBLY HAVING A COOLING SYSTEM

(75) Inventors: Klaus Busch, Amberg (DE); Günther Deinhardt, Amberg (DE); Alexander Reinhard, Amberg (DE); Christoph Wiesner, Amberg (DE)

(73) Assignee: Siemens AG, München (DE)

( * ) Notice: Subject to any disclaimer, the term of this patent is extended or adjusted under 35 U.S.C. 154(b) by 0 days.

(21) Appl. No.: 12/765,957

(22) Filed: Apr. 23, 2010

(65) Prior Publication Data

US 2010/0271781 A1    Oct. 28, 2010

(30) Foreign Application Priority Data

Apr. 27, 2009  (EP) .................................... 09158808

(51) Int. Cl.
   *H05K 7/20*   (2006.01)
(52) U.S. Cl. ........ 361/704; 361/702; 361/703; 361/710; 361/715; 361/719; 361/679.54; 165/80.2; 165/80.3; 165/185
(58) Field of Classification Search ............. 361/679.46, 361/679.47, 679.53, 679.54, 688, 689, 699, 361/715, 719–722, 700–712; 165/80.2, 80.3, 165/80.4, 80.5, 104.33, 104.34, 185; 257/706–727, 257/E23.09, E23.1, E23.103; 174/15.1, 16.3, 174/252; 29/890.03
See application file for complete search history.

(56) References Cited

U.S. PATENT DOCUMENTS

| | | | | |
|---|---|---|---|---|
| 4,226,281 A * | 10/1980 | Chu | ............................. | 165/80.2 |
| 4,235,283 A * | 11/1980 | Gupta | ......................... | 165/80.4 |
| 4,498,530 A * | 2/1985 | Lipschutz | .................... | 165/185 |
| 4,639,829 A * | 1/1987 | Ostergren et al. | ............. | 361/718 |
| 4,748,495 A * | 5/1988 | Kucharek | ....................... | 257/713 |
| 4,765,400 A * | 8/1988 | Chu et al. | ....................... | 165/185 |
| 4,770,242 A * | 9/1988 | Daikoku et al. | .............. | 165/185 |
| 4,800,956 A * | 1/1989 | Hamburgen | .................. | 165/185 |
| 4,942,497 A * | 7/1990 | Mine et al. | .................... | 361/702 |
| 5,052,481 A * | 10/1991 | Horvath et al. | ............... | 165/185 |
| 5,083,373 A * | 1/1992 | Hamburgen | ............... | 29/890.03 |
| 5,161,089 A * | 11/1992 | Chu et al. | ....................... | 361/703 |
| 5,329,426 A * | 7/1994 | Villani | .......................... | 361/719 |
| 5,648,890 A | 7/1997 | Loo et al. | | |
| 5,705,850 A * | 1/1998 | Ashiwake et al. | ............ | 257/714 |
| 5,774,334 A * | 6/1998 | Kawamura et al. | ........... | 361/699 |
| 5,787,576 A | 8/1998 | Warren et al. | | |
| 5,862,038 A * | 1/1999 | Suzuki et al. | ................. | 361/704 |
| 5,886,408 A | 3/1999 | Ohki et al. | | |

(Continued)

FOREIGN PATENT DOCUMENTS

DE    10 2005 049 872    4/2007

(Continued)

*Primary Examiner* — Michail V Datskovskiy

(74) *Attorney, Agent, or Firm* — Cozen O'Connor

(57) ABSTRACT

A cooling system comprising a heat sink having, a first contact zone and a second contact zone, which are configured to absorb, a first heat flow from a first component, a second heat flow from a second component, and a first transmission means for transmission of the first heat flow via the first contact zone into the heat sink. In addition, a first transmission means is arranged between the first component, and the heat sink and include a first plug means that is shaped such that the first plug means forms a first fit with a first bushing means that is arranged in the heat sink, where the first fit provides tolerance compensation between first and second contact zones.

13 Claims, 4 Drawing Sheets

U.S. PATENT DOCUMENTS

| | | | |
|---|---|---|---|
| 5,999,407 A * | 12/1999 | Meschter et al. | 361/704 |
| 6,223,815 B1 * | 5/2001 | Shibasaki | 165/185 |
| 6,313,995 B1 * | 11/2001 | Koide et al. | 361/705 |
| 6,404,638 B1 * | 6/2002 | Messina | 361/715 |
| 6,972,958 B2 * | 12/2005 | Mayer | 361/719 |
| 7,206,203 B2 * | 4/2007 | Campbell et al. | 361/699 |
| 7,397,664 B2 * | 7/2008 | Ankireddi | 361/710 |
| 7,486,514 B2 * | 2/2009 | Campbell et al. | 361/699 |
| 7,551,435 B2 * | 6/2009 | Taniguchi et al. | 361/679.53 |
| 7,719,842 B2 * | 5/2010 | Kreissig et al. | 361/719 |
| 7,786,486 B2 * | 8/2010 | Casey et al. | 257/76 |
| 2003/0150605 A1 * | 8/2003 | Belady et al. | 165/185 |
| 2008/0253090 A1 | 10/2008 | Janisch et al. | |

FOREIGN PATENT DOCUMENTS

EP    0 454 603    10/1991

\* cited by examiner

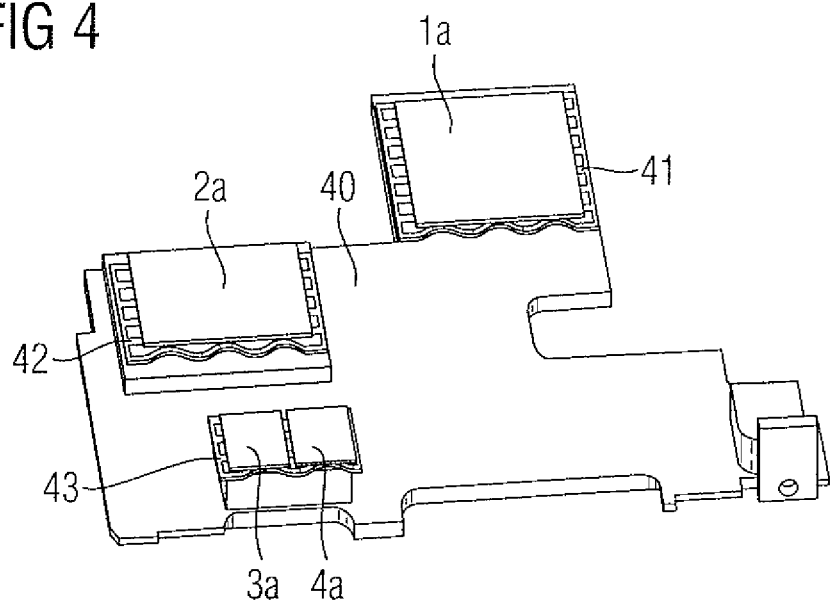
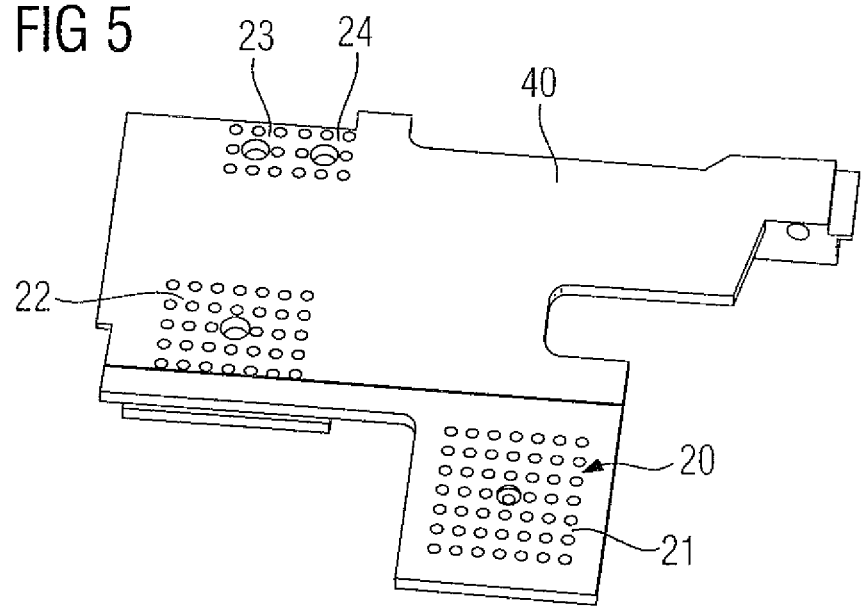

COOLING SYSTEM, COLD PLATE AND ASSEMBLY HAVING A COOLING SYSTEM

BACKGROUND OF THE INVENTION

1. Field of the Invention

The invention relates to a cooling system comprising a heat sink having a first contact zone and a second contact zone, which are configured to absorb a first heat flow from a first component and a second heat flow from a second component, and a first transmission means for transmission of the first heat flow through the first contact zone into the heat sink. The invention also relates to a cold plate having a first contact zone, and a second contact zone, configured for absorbing a first heat flow from a first component and a second heat flow from a second component.

The invention also relates to an electrical assembly having a printed circuit board, where the assembly included the cooling system.

2. Description of the Related Art

Due to the miniaturization of electronic components, a higher packing density/functional density is increasingly being provided by electronic components/parts on a printed circuit board assembly, such as a populated printed circuit board. This leads to an increase in the power loss, because the appliance functionality, and therefore the number of electronic components used, increase.

The use of microprocessors with higher clock rates is also leading to an increase in the power loss. Here, the developers of electronic components and printed circuit board assemblies are faced with the following problem with regard to optimization of the options for use and therefore the economy: increasing the power loss per assembly because of increasing packing densities and faster microprocessors, while simultaneously minimizing the appliance dimensions. This is leading to a more than proportional increase in the power loss density which, in the case of electronic assemblies, is defined as the power loss per unit volume. Consequently, there is a requirement to develop improved concepts, in the sense of the thermal power loss to be dissipated for heat dissipation from electronic assemblies, with the simultaneous optimum use of space.

In accordance with conventional technologies, thermal contact is made with electronic components on a cold plate, a heat sink or housing parts for this purpose. The heat can then be dissipated from the heat-emitting electronic component by free or forced convection into the heat sink and from the heat sink into the surrounding air.

In many electronic assemblies or appliances, there is a requirement for space and cost reasons to make thermal contact between a plurality of electronic components and a common cooling system.

EP 0 454 603 A2 discloses a cooling system in which thermal contact is made with a plurality of chips by a first flexible insert, in the form of a rib. A grid structure with obliquely positioned spring arms is fitted to the first flexible insert, and a second flexible insert is fitted to this grid structure and makes thermal contact with an upper shell of the cooling system, with the upper shell being firmly screwed to a lower shell of the cooling system. This solution has the disadvantage that three transmission means must be arranged between a heat-emitting component and a cold plate for use on a printed circuit board.

Making contact between a plurality of electronic components and a common cold plate is subject to the problem that the dimensional tolerances which the electronic components have mean that optimum thermal contact cannot be made at the same time between the cold plate and all the electronic components. For example, two electronic components that are arranged on a printed circuit board have a different height difference, which must be thermally bridged. This is normally achieved by use of a thermal interface material (TIM). Although this material, which compensates for the height difference, bridges the thermal heat dissipation path, it is not, however, optimally designed.

SUMMARY OF THE INVENTION

It is therefore an object of the invention to reduce the thermal resistance caused by different tolerance positions of the components in a thermal heat dissipation path, and thus to optimize the overall heat dissipation.

This and other objects and advantages are achieved by providing a cooling system in which a first transmission means is arranged between the first component and the heat sink and has a first plug means which is shaped such that the first plug means forms a first fit with a first bushing means which is arranged in the heat sink, where the first fit provides tolerance compensation between first and second contact zones, and provides a transmission path for the first heat flow into the heat sink. In this case, the plug means can be plugged into the heat sink, thus forming a thermal plug connector which allows axial mobility in the fit, and therefore allows tolerance compensation. The tolerances between the electronic components can now be compensated for individually by the effect that the plug means can be inserted like a sliding piece into the heat sink without, in the process, significantly changing the thermal contact resistance.

By way of example, a lower face of a heat sink represents a flat surface and can necessarily rest only flat on an electrical component when dimensional tolerances exist between the electrical components, and the heat sink would therefore have to perform a tilting movement to make contact with both electrical components. However, in the process, the heat sink in turn loses the desired flat planar contact with a second component from which heat is to be dissipated. Since the first transmission means is likewise connected in a planar form to the first component from which heat is to be dissipated and has plug means which project into the heat sink, this effectively forms a telescopic heat transmission path in the heat sink which allows tolerance compensation.

In one advantageous embodiment, the cooling system is provided with a transmission means which has a lower face and an upper face, where the lower face is designed to match a contour of the first component, and the upper face is provided with an arrangement of pins and webs. When there are a plurality of these items, preferably in the form of pins, such as in the form of a matrix, preferably 10×10 pins, the thermal plug connector formed in this way creates a thermal parallel circuit. Here, the total resistance calculated from the thermal parallel circuit represents an optimized total thermal resistance.

A thermal heat dissipation path provided in this way is more effective, in the sense of the power loss to be dissipated, the lower the total thermal resistance comprising a multiplicity of parallel-connected thermal individual resistances.

In another embodiment, a first spring element is advantageously arranged between the first transmission means and the heat sink to further reduce the total thermal resistance. This spring element is used to produce a contact force between the upper face of the transmission means and the heat sink. In this case, if the spring element is preferably a corrugated leaf spring, then this further increases the contact force that is produced.

In order to keep the total thermal resistance as low as possible, the bushing means comprise an arrangement of a plurality of holes, i.e., drilled holes or slots. Here, the fit provided by the bushing means and the plug means comprises a clearance fit. In this case, the arrangement of the bushing means may preferably comprise a hole contour. This hole contour is designed to be identical to the contour of the plug means on the first transmission means, but its sizes and dimensions are designed to form a clearance fit. It is also advantageous for the fit to comprise a sliding piece, at least in certain places.

Advantageously, the transmission means partially comprises at least the materials aluminum copper, die-cast zinc and/or graphite, which have good levels of thermal conductivity.

If the transmission means is designed such that it has a base plate, on which the plug means are arranged essentially at right angles thereto, then this base plate is advantageously manufactured from graphite. Graphite is distinguished by a high thermal conductivity of about 400 W/m K. This relatively high thermal conductivity is particularly evident when the graphite is fitted or arranged such that this high thermal conductivity can be expected on an axis parallel to the component from which heat is to be dissipated. The transmission means designed in this way therefore advantageously provides "heat spreading" on the plane, thus reducing the heat flux density and therefore so-called "hot spots" on the electronic component.

In one alternative embodiment, the cooling system includes mounting means for mounting the cooling system on a printed circuit board. Mounting means may be threaded holes with screws, brackets, slots, etc.

The object is likewise achieved by a cold plate in that at least the first contact zone of the cold plate is provided with bushing means to allow tolerance compensation for the contact zones in an arrangement of the components, with respect to joint heat dissipation from the components. Cold plates such as these can be used to dissipate heat jointly from a multiplicity of electronic components. Cold plates have the advantage that they occupy less space than, for example, a ribbed heat sink. Furthermore, in the case of electronic assemblies, cold plates can assume an integrative component of the design, and can therefore be used for additional robustness or for a basic design of an assembly.

Further advantages, which can also be considered to be advantages of the cooling system, are that a moving heat-sink unit provides automatic tolerance compensation between the electronic components of different heights and a common cold plate. One quality of the thermal contact between the electronic components and the cold plate is independence from the position of the transmission means, which move relative to the heat sink, where a heat spreader is preferably used as the transmission means. As a result, a cost-effective assembly is provided, because no adjustment or setting is required as a function of the actual dimensions of the electronic components. Furthermore, a cooling system such as this can be produced cost-effectively either with a ribbed heat sink or the cold plate, without the complex multiple-layer spring elements for making thermal contact with the chips as disclosed in EP 0 454 603 A2.

An electrical assembly having a printed circuit board, where a first component which emits a first heat flow and a second component which emits a second heat flow are arranged on the printed circuit board, achieves the object of the disclosed embodiments of the invention in that the assembly has a cooling system or alternatively a cold plate, as described above.

In one embodiment of the assembly, the printed circuit board includes mounting elements for mounting the cooling system. In order to allow a contact pressure, and therefore a reduced thermal contact resistance, a compression spring is arranged between an opposing bearing on the mounting element and the printed circuit board.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Further features and refinement variants are illustrated in the drawings, in which:

FIG. 4 shows an alternative exemplary embodiment of the invention with a cold plate in accordance with the invention;

FIG. 5 shows a bottom view of the cold plate of FIG. 4;

DETAILED DESCRIPTION OF THE PRESENTLY PREFERRED EMBODIMENTS

Figure 1:
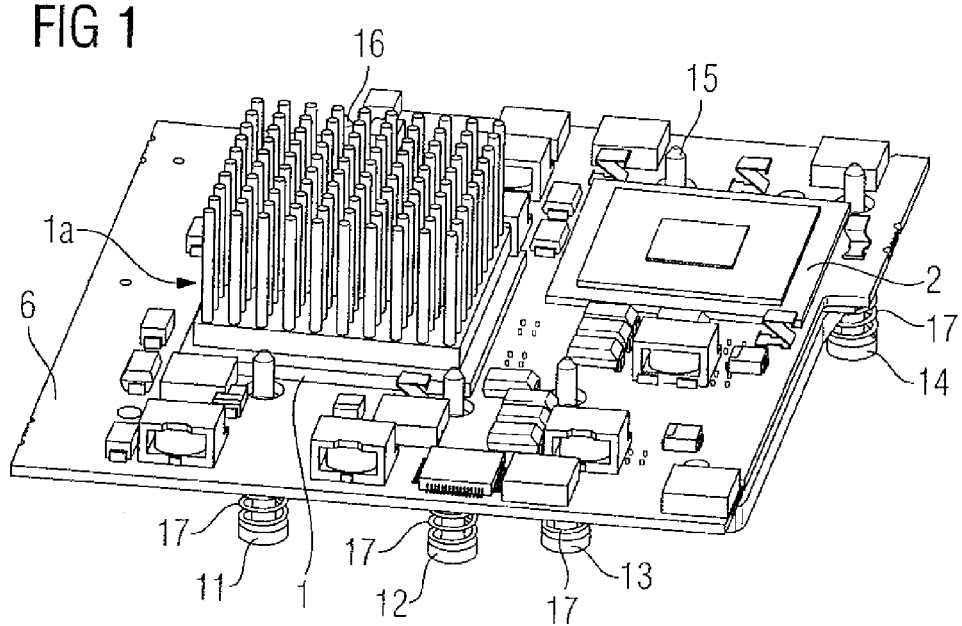
FIG. 1 shows an exemplary printed circuit board assembly having two microprocessors in accordance with the embodiment of the invention.
Figure 2:
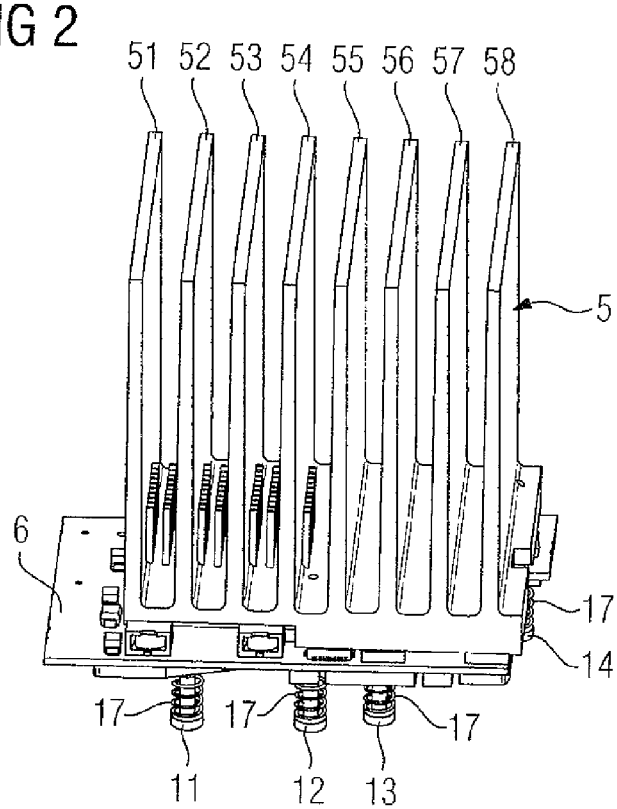
FIG. 2 shows the printed circuit board assembly of FIG. 1 with a heat sink.

FIG. 1 shows a perspective view of a printed circuit board 6. In addition to a first component 1 and a second component 2, a multiplicity of further small components, such as coils, resistors, capacitors, are arranged on the printed circuit board 6. The first component 1 comprises a first microprocessor unit, and the second component 2 comprises a second microprocessor unit. A printed circuit board 6 populated in this way represents a printed circuit board assembly. During operation of this printed circuit board assembly, the first component 1 and the second component 2, in particular, produce heat losses. These heat losses must be dissipated. In order to dissipate the heat losses from the first component 1, a first transmission means 1a is arranged on the first component 1. The first transmission means 1a has a base plate with a lower face and an upper face. A pin structure is arranged on the upper face, with the individual pins of the pin structure being arranged essentially at right angles to the upper face of the base plate. 10×10 individual pins therefore project out of the base plate. These 100 individual pins can be plugged into a heat sink 5, as shown in FIG. 2. Here, each of these individual pins has an individual thermal resistance. By connecting the individual thermal resistances of these 100 pins in parallel, a lower total resistance is achieved than could be achieved, for example, by a TIM.

The cooling system shown in FIG. 2 comprises a heat sink 5 with a first contact zone 21 and a second contact zone 22 (in this context see FIG. 3), where the first contact zone 21 and the second contact zone 22 are configured to absorb a first heat flow from the first component 1 and a second heat flow from the second component 2.

In the illustration shown in FIG. 2, the first component 1 and the second component 2 are concealed by the heat sink. However, FIG. 3 clearly shows that the first contact zone 21 is thermally connected by the first transmission means 1a to the first component 1, and that the second contact zone 22 has a cutout formed therein such that the second contact zone 22 is located with a good thermal connection on the surface of the second component 2. The first transmission means 1a is arranged between the first component 1 and the heat sink 5 and, with the 100 individual pins, has a first plug means. This first plug means engages with a first bushing means, which is arranged in the heat sink 5, and thus forms a first fit, with this first fit providing tolerance compensation and a transmission path for the first heat flow into the heat sink 5.

The heat sink 5 is arranged on the second component 2, with its second contact zone 22, such that the second contact zone 22 rests in a planar form on the surface contour of the second component 2. A tolerance which occurs because of the different heights of the first component 1 and of the second component 2 can be compensated for by the pins of the plug means, which can move in the drilled holes in the hole structure 20 in the heat sink 5. The heat sink 5 comprises a ribbed heat sink with a first cooling rib 51 up to an eighth cooling rib 58. The drilled holes in the hole structure 20 are arranged in the heat sink 5 such that a third row of pins of the first transmission means 1a disappears entirely in a wall of the second cooling rib 52. In this case, a fourth and a fifth row of pins of the first transmission means 1a are arranged between the second cooling rib 52 and the third cooling rib 53. A sixth row of pins of the transmission means 1a is in turn plugged entirely in the third cooling rib 53.

In order to provide a printed circuit board assembly such as this with the heat sink 5 during manufacture, all that is now necessary is to place the heat sink 5 exactly on the second component 2, with tolerance compensation for the first component 1 with respect to the heat sink 5 being achieved by the first transmission means 1a, which is plugged telescopically into the heat sink 5.

Figure 3:
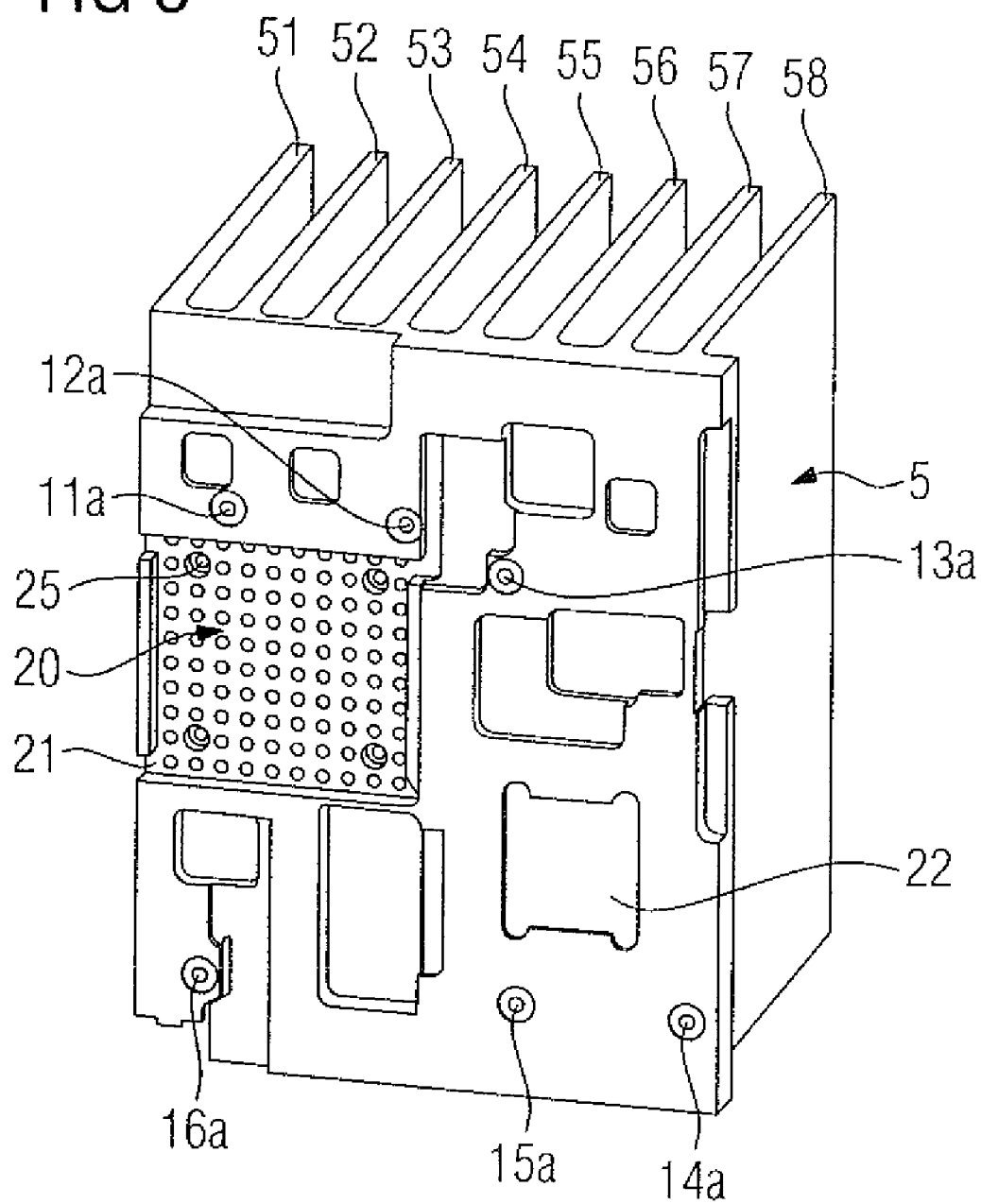
FIG. 3 shows a perspective view of the heat sink of FIG. 2.

The perspective view in FIG. 3 clearly shows the bottom view of the heat sink 5 and, in addition to the hole structure 20 for the first contact zone 21, and a planar structure for the second contact zone 22, the surface of the lower face has a plurality of depressions and recesses, which are preferably incorporated in the heat sink 5, in order to create space for various components arranged on the printed circuit board 6.

A first threaded hole 11a, a second threaded hole 12a, a third threaded hole 13a, a fourth threaded hole 14a, a fifth threaded hole 15a and a sixth threaded hole 16a are arranged in a clockwise circular shape around the first contact zone 21 and around the second contact zone 22. These threaded holes 11a to 16a are used to hold mounting elements 11 to 16. The mounting elements 11 to 16 (see FIGS. 1 and 2) are in this case in the form of a threaded screw which is held by the threaded holes 11a to 16a. Here, the first mounting element 11 has an opposing bearing at one of its ends, in the form of a screw head on which a compression spring 17 is supported. This compression spring 17 produces a contact pressure for the printed circuit board 6 against the heat sink 5.

FIGS. 4 and 5 show an alternative exemplary embodiment of a ribbed heat sink. Here, a cold plate 40 includes bushing means for a first transmission means 1a, a second transmission means 2a, a third transmission means 3a and a fourth transmission means 4a at different points on the cold plate 40. A first leaf spring 41 is arranged between the cold plate 40 and the first transmission means 1a. A second leaf spring 42 and a third leaf spring 43 are arranged correspondingly for the three further transmission means 2a, 3a, 4a, between the cold plate 40 and the transmission means 2a, 3a, 4a.

A further possible way to produce a contact pressure is to use compression springs, preferably spiral springs, instead of the leaf springs 41, 42, 43. These can be mounted and guided in appropriate compression-spring holders (see FIG. 3) on the heat sink 5.

A third leaf spring 43 forms a special feature and comprises a common leaf spring for two transmission means 3a and 4a which are plugged in independently. The pins for the transmission means and for the corresponding hole structures 20 once again provide a clearance fit.

Figure 6:
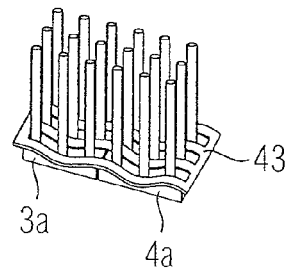
FIGS. 6-8 show various leaf springs in combination with different transmission means in accordance with embodiments of the invention.
Figure 7:
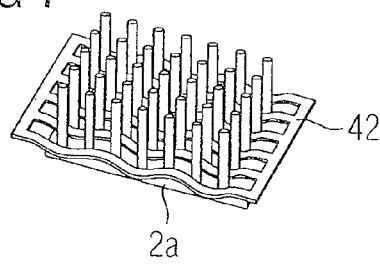
Figure 8:
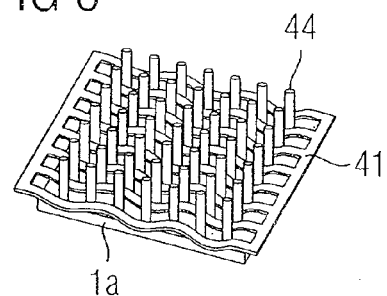

In this case, FIGS. 6 to 8 illustrate the configurations of the leaf springs 41, 42, 43. The corrugated leaf springs 41, 42, 43 have longitudinal slots, with each slot being configured to hold one row of pins of the respective transmission means 1a, 2a, 3a and 4a.

Figure 9:
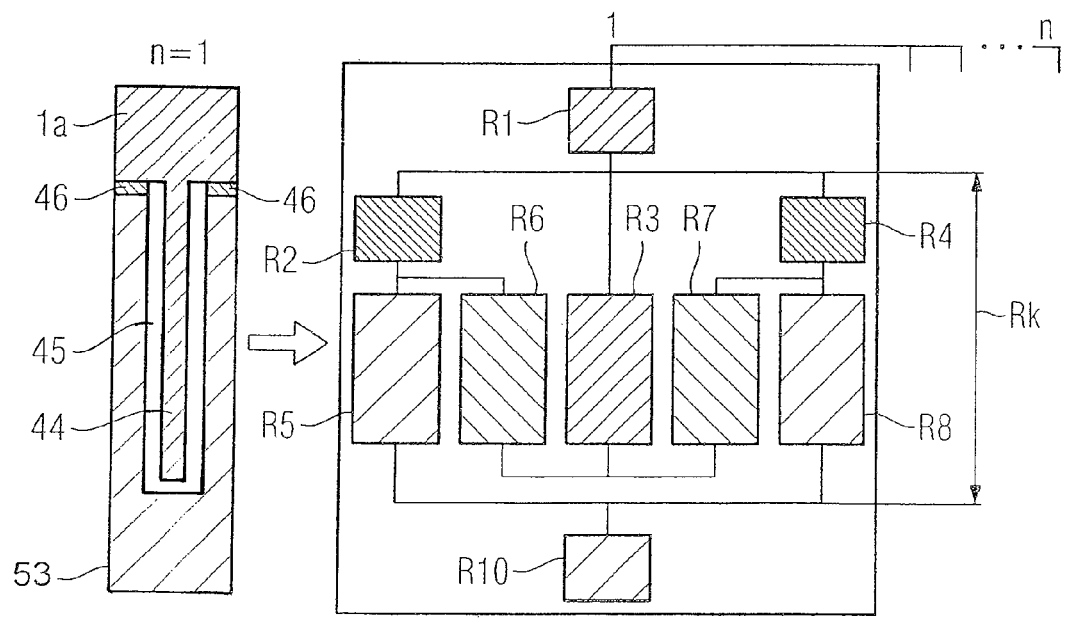
FIG. 9 shows a simplified thermal calculation model for a plug connector in accordance with the embodiments of the invention.

FIG. 9 shows a simplified thermal calculation model for a plug connector formed by the heat sink 5 and by the first transmission means 1a. By way of example, the third cooling rib 53 of the heat sink 5 is illustrated in the form of a section on the left-hand side of the calculation model. The first transmission means 1a is likewise shown in the form of a detail section illustration, and an illustrated pin 44 is shown plugged in the drilled hole which is arranged in the third cooling rib 53. A contact surface 46 is in each case located to the right and left of the pin 44, between the transmission means 1a and the third cooling rib 53. The pin 44 is plugged into the drilled hole, and comprises a clearance fit with surrounding air 45.

In order to derive a simplified and fundamental calculation approach for the heat transmission mechanism, the calculation model can be represented with a transmission means resistance R1, a contact surface resistance R2, a pin resistance R3, a further contact surface resistance R4, a rib resistance R5 on the left-hand side, a rib resistance R8 on the right-hand side, and an air resistance R6, R7 with a total heat sink resistance RK. The abovementioned resistance designations in this exemplary embodiment should be regarded only as thermal resistances.

Because of the thermal parallel connection of n rib/groove connections, where n=8 for eight cooling ribs and a groove should be understood as meaning a drilled hole or slot in which the pin is plugged, it is sufficient for the fundamental description to analyze one rib/groove connection (n=1). In this case, because of the small proportion of the surface area, end-face heat transmission from the ribs is ignored. The heat transmission through the side air gaps of a rib and the associated contact surfaces is therefore calculated. As an overall system, the plug connector is calculated from the sum of the individual resistances.

The thermal contact resistance Rthk of an air gap (½ rib/groove connection) is given by:

$$Rthk = \frac{1}{\sum \left[ \frac{1}{Rth2} + \frac{1}{Rth3 + Rth6} \right]} + Rth5$$

The equation for the plug connector with n rib/groove connections is:

$$Rthktot = \frac{Rthk}{2*n}$$

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A cooling system comprising:
    a heat sink having a first contact zone and a second contact zone, said first and second contact zones being configured to absorb a first heat flow from a first component and a second heat flow from a second component; and
    a first transmission means for transmission of the first heat flow through the first contact zone into the heat sink, said first transmission means being arranged between the first component and the heat sink and including a first plug component shaped to form a first fit with a first bushing arranged in the heat sink;
    wherein the first fit provides tolerance compensation for the first and second contact zones and a transmission path for the first heat flow into the heat sink; and
    wherein the cooling system is configured to be mounted on a printed circuit board including a plurality of mounting elements and a compression spring arranged between an opposing bearing on the plurality of the mounting elements and the printed circuit board.

2. The cooling system as claimed in claim 1, wherein the first transmission means has a lower face and an upper face, wherein the lower face is configured to match a contour of the first component, and the upper face is provided with an arrangement of pins.

3. The cooling system as claimed in claim 1, further comprising a first spring element arranged between the first transmission means and the heat sink.

4. The cooling system as claimed in claim 2, further comprising a first spring element arranged between the first transmission means and the heat sink.

5. The cooling system as claimed in claim 1, wherein the bushing comprises an arrangement of a plurality of holes.

6. The cooling system as claimed in claim 1, wherein the first fit is a clearance fit.

7. The cooling system as claimed in claim 1, wherein the first fit comprises a sliding piece in specific places.

8. The cooling system as claimed in claim 1, wherein the first transmission means partially comprises at least one of aluminum, copper, die-cast zinc and graphite.

9. The cooling system as claimed in one claim 1, wherein the first transmission means further comprises a base plate, the first plug component being arranged, essentially at right angles to the base plate, the base plate being manufactured from graphite.

10. The cooling system as claimed in one of claim 3, wherein the first spring element is a corrugated leaf spring.

11. The cooling system as claimed in claim 3, further comprising mounting means for mounting on a printed circuit board.

12. The cooling system as claimed in claim 5, wherein the arrangement of the plurality of holes is one of drilled holes and slots.

13. An electrical assembly, comprising:
    a printed circuit board including a plurality of mounting elements;
    a first component which emits a first heat flow; and
    a second component which emits a second heat flow, the first and second components being arranged on the printed circuit board; and
    a cooling system mounted on the printed circuit board by the plurality of mounting elements, the cooling system comprising:
    one of a heat sink and a cold plate having a first contact zone and a second contact zone, said first and second contact zones being configured to absorb the first heat flow from the first component and the second heat flow from the second component;
    a first transmission means for transmission of the first heat flow through the first contact zone into the heat sink or the cold plate, said first transmission means being arranged between the first component and the heat sink and including a first plug component shaped to form a first fit with a first bushing means arranged in at least one of the heat sink and the cold plate; and
    a compression spring arranged between an opposing bearing on the plurality of the mounting elements and the printed circuit board;
    wherein the first fit provides tolerance compensation for the first and second contact zones and a transmission path for the first heat flow into at least one of the heat sink and the cold plate.

* * * * *